(12) United States Patent
Gandhi

(10) Patent No.: US 6,759,837 B2
(45) Date of Patent: Jul. 6, 2004

(54) METHODS AND APPARATUS FOR PHASE COMPENSATION IN ELECTRONIC ENERGY METERS

(75) Inventor: Guljeet S. Gandhi, Noida (IN)

(73) Assignee: Analog Devices, Inc., Norwood, MA (US)

(*) Notice: Subject to any disclaimer, the term of this patent is extended or adjusted under 35 U.S.C. 154(b) by 168 days.

(21) Appl. No.: 09/940,779

(22) Filed: Aug. 28, 2001

(65) Prior Publication Data

US 2003/0042886 A1 Mar. 6, 2003

(51) Int. Cl.[7] .......................... G01R 11/32; G01R 35/00
(52) U.S. Cl. ........................ 324/74; 324/142; 702/106
(58) Field of Search .............................. 324/76.48, 74, 324/76.54, 130, 76.52, 142; 702/85, 106, 66, 71, 89, 72, 80, 60

(56) References Cited

U.S. PATENT DOCUMENTS

| | | |
|---|---|---|
| 5,017,860 A | 5/1991 | Germer et al. |
| 5,231,347 A | 7/1993 | Voisine et al. |
| 5,485,393 A | 1/1996 | Bradford |
| 6,043,642 A | 3/2000 | Martin et al. |
| 6,304,202 B1 | 10/2001 | Pastorello et al. |
| 6,373,415 B1 | 4/2002 | King et al. |

FOREIGN PATENT DOCUMENTS

EP 0 634 662 A1 1/1995

OTHER PUBLICATIONS

Putnam et al., "Design of Fractional Delay Filters Using Convex Optimization", *Department of Electrical Engineering and Center for Research in Music and Acoustic*, 4 pages.
U.S. patent application Ser. No. 09/777,736, Gandhi, filed Feb. 5, 2001.

*Primary Examiner*—Kamand Cuneo
*Assistant Examiner*—Paresh Patel
(74) *Attorney, Agent, or Firm*—Wolf, Geenfield & Sacks, P.C.

(57) ABSTRACT

An electronic meter includes a sensing circuit for sensing voltage and current values of a waveform, an analog-to-digital converter for converting the sensed voltage and current values to digital voltage and current values, a digital filter for delaying one or both of the digital voltage and current values to compensate for a phase shift error in the sensing circuit, and a computation circuit for computing one or more parameters of the waveform in response to the phase compensated voltage and current values. The electronic meter may be calibrated by applying to the meter a test waveform having a known phase shift, measuring the phase shift using the electronic meter, determining a phase shift error based on the difference between the known phase shift and the measured phase shift and determining digital filter coefficients to produce a digital filter delay that corresponds to the phase shift error.

7 Claims, 7 Drawing Sheets

METHODS AND APPARATUS FOR PHASE COMPENSATION IN ELECTRONIC ENERGY METERS

FIELD OF THE INVENTION

This invention relates to electronic meters and, more particularly, to methods and apparatus for phase compensation in electronic energy meters. The electronic energy meters may be configured for measuring a polyphase power line. Phase errors may be different for different current transformers in the energy meter and may be a function of current in the power line being measured.

BACKGROUND OF THE INVENTION

Electronic energy meters have been developed for measuring the consumption of electrical energy on power lines. One architecture utilizes a digital signal processor for calculating various electrical parameters based on measured values of voltage and current, and a microcontroller for controlling the storage, display and communication of the electrical parameters calculated by the digital signal processor.

In this architecture, the phase voltages are scaled down to lower voltages using potential dividers, and the line currents are supplied to the primary windings of current transformers. The secondary windings of the current transformers provide current outputs proportional to a turns ratio between the secondary and primary windings of the transformer. A resistor with a very low temperature coefficient connected to the secondary winding of the current transformer provides a potential proportional to the value of the resistance and the current in the secondary winding. These signal conditioned voltage and current signals are supplied to an analog-to-digital converter and are digitized at periodic intervals. The digitized signals are supplied to the digital signal processor to compute instantaneous power and are integrated for a finite number of power line cycles to compute energy.

As inductive elements, the current transformers exhibit a phase lag between the primary and secondary windings. The phase lag may be different for different phases of the power line due to differences between individual current transformers and may be a nonlinear function of line current. Because certain measurements by the electronic energy meter are a function of the phase difference between current and voltage, measurement errors are produced. The errors due to the phase lag therefore adversely affect the accuracy of the electronic energy meter.

Power meter manufacturers typically implement conventional phase shifters using variable resistors and/or variable capacitors for each of the three phases of the power line. This approach increases material and production costs. Techniques have been developed that use two analog-to-digital converters and shift the sampling time of one of the converters with respect to the other. This approach requires additional circuitry and increases the cost of the hardware. These techniques do not compensate for the nonlinearity of the phase shift as a function of current that is exhibited by the current transformers. Prior art phase compensation techniques have been disclosed, for example, in U.S. Pat. No. 5,017,860 issued May 21, 1991 to Germer et al. and U.S. Pat. No. 5,231,347 issued to Jul. 27, 1993 to Voisine et al.

Accordingly, there is a need for improved methods and apparatus for phase compensation in electronic energy meters.

SUMMARY OF THE INVENTION

According to a first aspect of the invention, an electronic meter is provided. The electronic meter comprises a sensing circuit for sensing voltage and current values of a waveform, an analog-to-digital converter for converting the sensed voltage and current values to digital voltage and current values, a digital filter for delaying one or both of the digital voltage and current values to compensate for a phase shift error in the sensing circuit, and a computation circuit for computing at least one parameter of the waveform in response to the phase compensated voltage and current values.

The digital filter and the computation circuit may be implemented in a digital signal processor. The sensing circuit may comprise circuitry for sensing voltage and current values of each phase of a polyphase power line. The electronic meter may include a digital filter for delaying the digital voltage values of each phase to compensate for the phase shift error associated with each phase of the polyphase power line. The electronic meter may further comprise means responsive to the current value of the waveform for selecting a set of digital filter coefficients that corresponds to the current value and for applying the selected set of digital filter coefficients to the digital filter. The digital filter may comprise a fractional delay filter for delaying the digital voltage values in increments that are a fraction of the sampling interval of the analog-to-digital converter.

According to another aspect of the invention, a method is provided for calibrating an electronic meter. The method comprises the steps of (a) applying to an input of the electronic meter a test waveform having a known phase shift between voltage and current, (b) measuring a phase shift between the voltage and the current of the test waveform using the electronic meter, (c) determining a phase shift error based on the difference between the known phase shift and the measured phase shift, (d) determining digital filter coefficients to produce a digital filter delay that corresponds to the phase shift error, and (e) saving the digital filter coefficients to compensate for the phase shift error during normal metering operation.

In a preferred embodiment, step (a) comprises applying waveforms of a polyphase power line to the input of the electronic meter and steps (b), (c), (d) and (e) are repeated for each phase of the polyphase power line. Steps (a), (b), (c), (d) and (e) may be repeated for predetermined current ranges to provide a set of digital filter coefficients for each of the predetermined current ranges.

The digital filter coefficients may be determined in a computing device external to the electronic meter and may be downloaded from the external computing device to the electronic meter. In a preferred embodiment, the electronic meter includes a digital signal processor, and the digital filter coefficients are downloaded to the digital signal processor. Step (b) may comprise measuring the power factor of a test waveform with the electronic meter, sending the measured power factor to the external computing device and determining the measured phase shift, in the external computing device, from the measured power factor in the external computing device.

According to a further aspect of the invention, a method is provided for operating an electronic meter. The method comprises the steps of sensing voltage and current values of a waveform using a sensing circuit, converting the sensed voltage and current values to digital voltage and current values, delaying one or both of the digital voltage and current values using a digital filter to compensate for a phase shift error by the sensing circuit, and computing at least one parameter of the waveform in response to the phase compensated voltage and current values.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
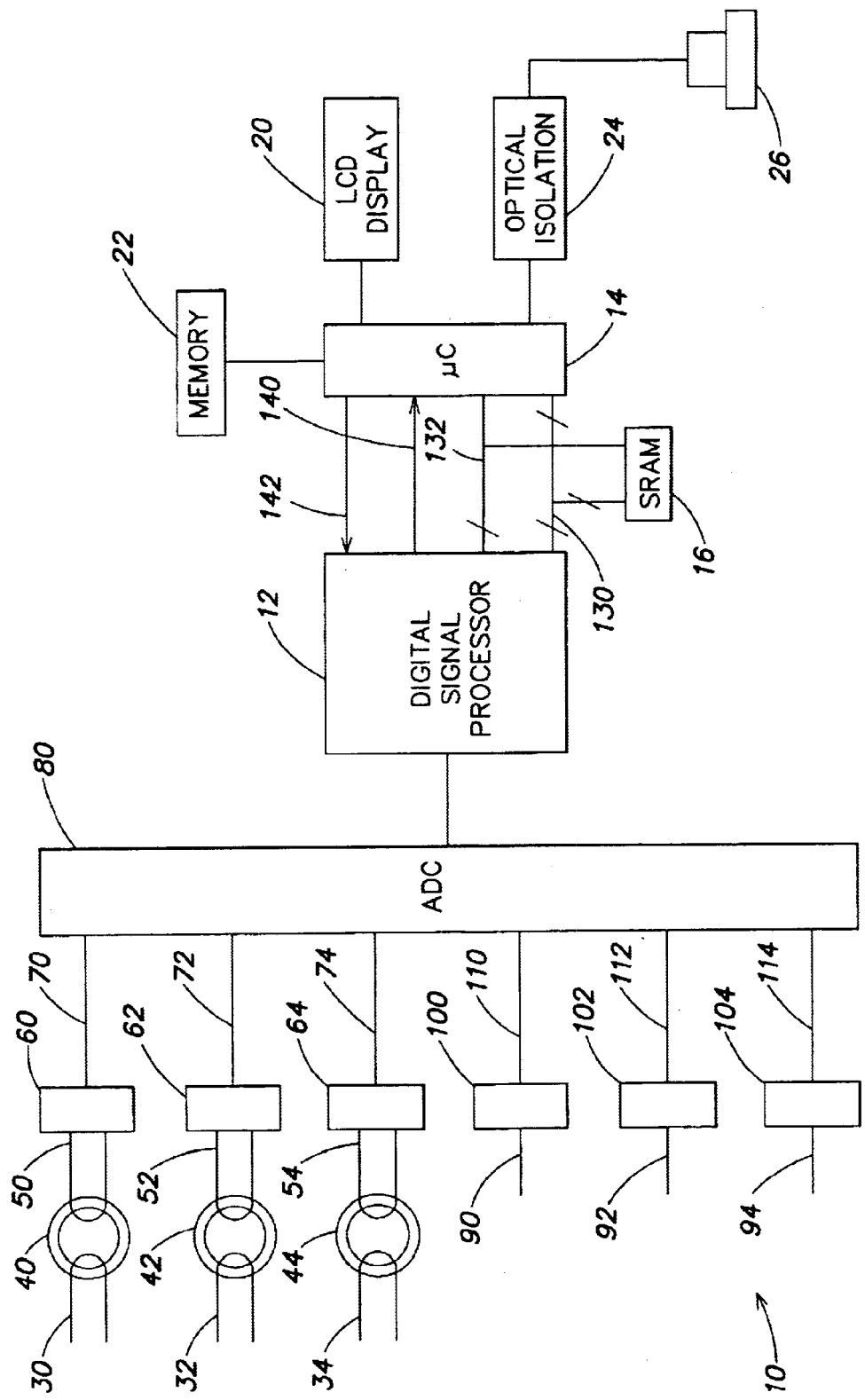
FIG. 1 is a block diagram of an electronic energy meter in accordance with an embodiment of the invention.

An example of an electronic meter in accordance with an embodiment of the invention is shown in FIG. 1. A three phase electronic watthour meter includes a sensing circuit 10, a digital signal processor 12, a microcontroller 14 and a memory 16. The electronic meter may further include a display 20 and a memory 22 connected to microcontroller 14. The microcontroller 14 may be connected through an optical isolator 24 to an external terminal 26 or other external device. Other external devices, for example, may include printers, storage devices and/or communication links to remote monitoring devices.

In the embodiment of FIG. 1, sensing circuit 10 senses current and voltage values of a three phase power line, digitizes the sensed current and voltage values and supplies the digitized current and voltage values to digital signal processor 12. Line currents 30, 32 and 34 of the three phase power line are supplied to primary windings of current transformers 40, 42 and 44, respectively. Secondary windings 50, 52 and 54 of current transformers 40, 42 and 44 are connected to terminating resistors 60, 62 and 64, respectively, to provide voltage signals 70, 72 and 74, which are proportional to the respective line currents and which are referred to hereinafter as line current signals 70, 72 and 74. The line current signals 70, 72 and 74 are provided to an analog-to-digital converter 80. Phase voltages 90, 92 and 94 are supplied to voltage dividers 100, 102 and 104, respectively, to provide low level voltage signals 110, 112 and 114, which are proportional to the respective phase voltages and which are referred to hereinafter as phase voltage signals 110, 112 and 114. The phase voltage signals 110, 112 and 114 are input to analog-to-digital converter 80. Sensing circuit 10 thus has three current sensing channels and three voltage sensing channels in the embodiment of FIG. 1.

Analog-to-digital converter 80, which may be a multi-channel simultaneous or sequential sampling converter, digitizes the line current and phase voltage signals and transmits the digitized signals to a serial port of the digital signal processor 12. In a preferred embodiment, the analog-to-digital converter 80 samples the signals at a sampling rate of 15 kilohertz per channel. Each digital signal includes a series of data samples that represent a phase voltage value or a line current value.

The digital signal processor 12 receives the serial data from the analog-to-digital converter 80 and stores the data in its internal data memory. This raw data, representative of line currents and phase voltages, is used by digital signal processor 12 to perform various computations over an integral number of line cycles. These computations may include the root mean square value of each phase voltage, the root mean square of each line current and instantaneous value of active power as described below. Multiplication of the root mean square value of current and voltage provides apparent power. Integration of these powers provides the respective energies. The ratio of apparent power to active power provides the power factor. As further described below, digital signal processor 12 performs phase compensation for phase shift errors introduced by sensing circuit 10.

The digital signal processor 12 and the microcontroller 14 are connected to memory 16 by a data bus 130 and an address bus 132. In one embodiment, memory 16 is a static random access memory (SRAM) having a capacity of 512K bits, and data bus 130 is an 8 bit bus. The memory 16 may be used as a scratch pad between the digital signal processor 12 and the microcontroller 14 to read and write data without adversely affecting the operations of either processor. In one embodiment, digital signal processor 12 performs calculations on the digitized current and voltage signals supplied from sensing circuit 10 to determine parameter values of the three phase power line and writes the calculated parameter values to memory 16. The microcontroller 14 reads the parameter values from memory 16 and supplies the parameter values to memory 22 for storage, to display 20 and/or to external terminal 26.

As discussed above, line currents 30, 32 and 34 of the three phase power line are supplied to current transformers 40, 42 and 44, respectively. Current transformers 40, 42 and 44 exhibit a phase lag between the input and output currents. The phase lag by current transformers 40, 42 and 44 introduces a phase shift between line current signals 70, 72 and 74 and the respective phase voltage signals 110, 112 and 114 prior to measurement by the digital signal processor 12. Certain measurements by digital signal processor 12 are a function of the phase difference between the respective line current and phase voltage signals. Since sensing circuit 10 alters the phase difference between the line current signals and the respective phase voltage signals, these signals do not accurately represent the phase difference between the line currents and the respective phase voltages at the input to the electronic meter, and phase compensation is required to avoid inaccurate measurements.

Figure 2:
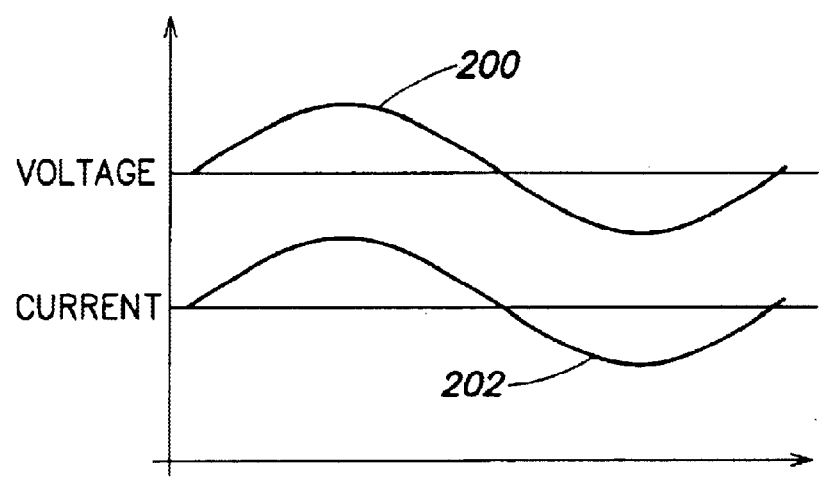
FIG. 2 is a graph of voltage and current signals as a function of time, illustrating an in-phase condition.
Figure 3:
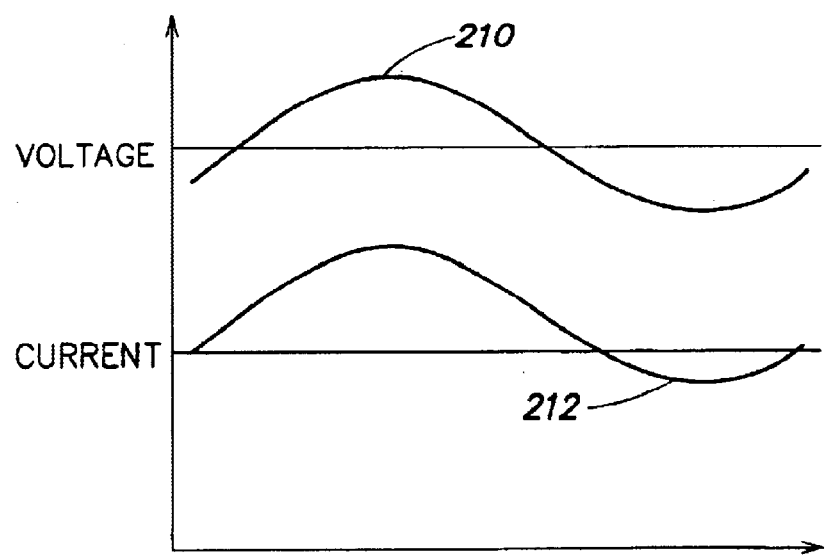
FIG. 3 is a graph of voltage and current signals as a function of time, illustrating a delayed current signal with respect to the voltage signal caused by the phase lag through a current transformer.

Examples of a phase voltage 200 and a line current 202 are shown in FIG. 2. In the example of FIG. 2, phase voltage 200 and line current 202 are in phase. Phase voltage 200 and line current 202 may correspond, for example, to phase voltage 90 and line current 30, respectively, in FIG. 1. Examples of a phase voltage signal 210 and a line current signal 212 are shown in FIG. 3. Phase voltage signal 210 and line current signal 212 may correspond to phase voltage signal 110 and line current signal 70, respectively, in FIG. 1. Line current signal 212 is delayed relative to phase voltage signal 210 as a result of the phase lag of current transformer 40. Thus, the phase voltage signal 210 and the line current signal 212 supplied to analog-to-digital converter 80 and digital signal processor 12 do not accurately represent phase voltage 200 and line current 202.

Figure 4:
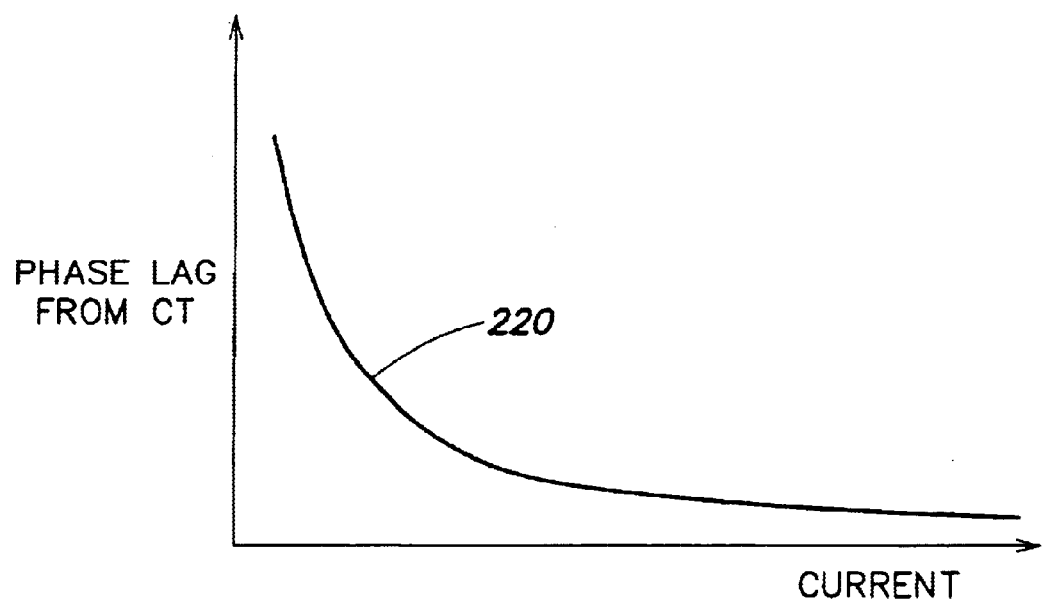
FIG. 4 is a graph of phase lag through the current transformer as a function of current.

Current transformers 40, 42 and 44 introduce a phase lag that is a function of a number of conditions. Even though current transformers 40, 42 and 44 may have a nominally identical construction, they are subject to variations in phase lag as a result of component tolerances. In addition, the phase lag introduced by current transformers 40, 42 and 44 is a function of the current level of line currents 30, 32 and 34. Referring to FIG. 4, a curve 220 represents phase lag of the current transformer as a function of line current. As shown, the phase lag increases as line current decreases. Thus, the phase lag introduced by sensing circuit 10 varies for different current transformers and varies as a function of line current in each phase of the three phase power line.

In accordance with an aspect of the invention, phase compensation is performed by one or more digital filters implemented in digital signal processor 12. The digital filters are programmed to delay the digitized voltage value relative to the digitized current value to compensate for the phase lag introduced by the sensing circuit. The delayed voltage and current values thus represent the true phase difference between the phase voltage and the line current at the input to the electronic meter. The digital filters are programmed to provide the required delay by supplying them with digital filter coefficients determined during calibration of the electronic meter as described below. The digital filter coefficients are specific to a meter channel and line current level.

Figure 5:
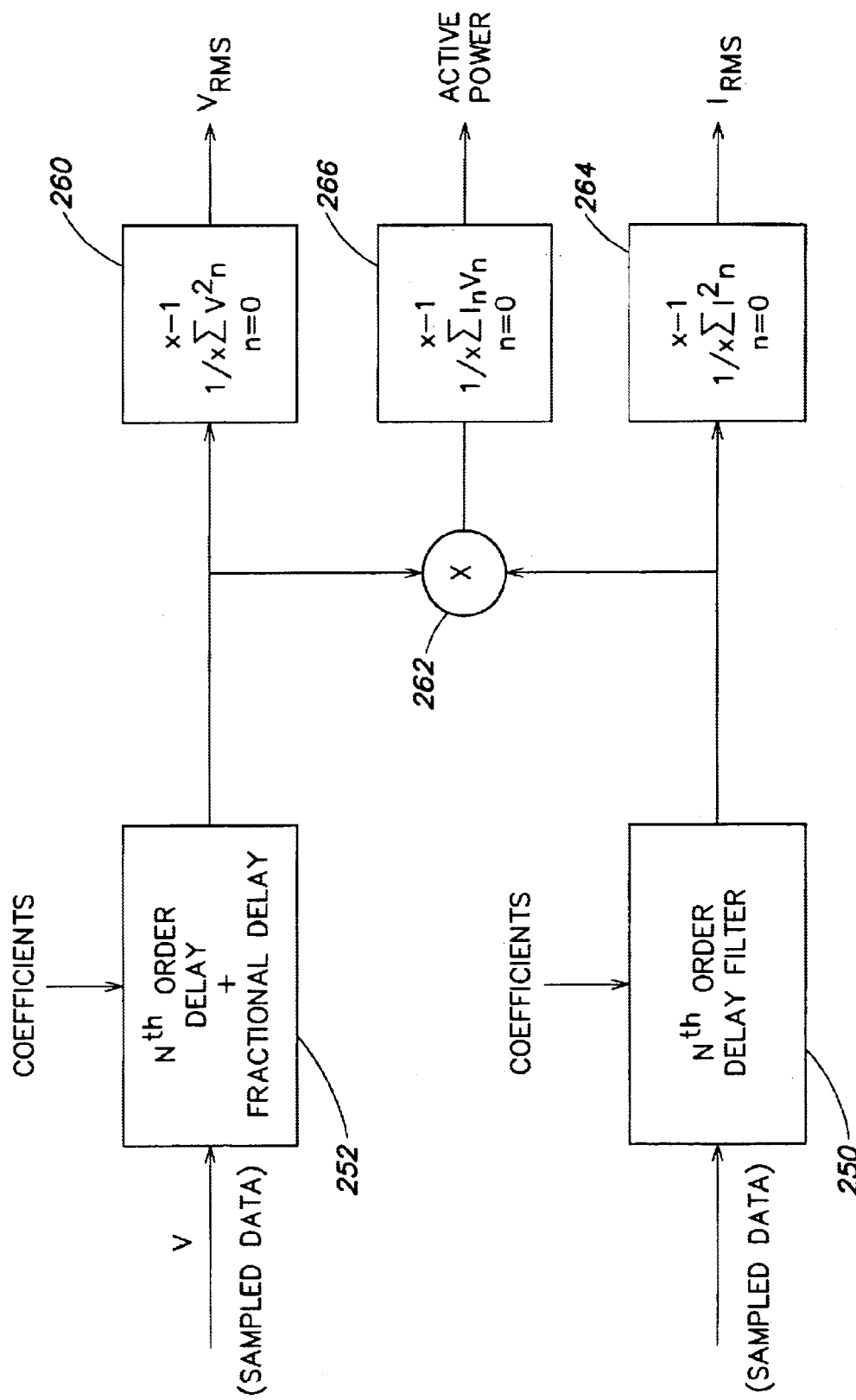
FIG. 5 is a block diagram of an example of a digital signal processor configuration that utilizes digital filters to delay the voltage and current sampled data prior to computation of active power and RMS voltage and current values.

A functional block diagram showing the phase compensation implemented by digital signal processor 12 is shown in FIG. 5. A digitized line current signal for one of the input channels is supplied to an Nth order delay digital filter 250, and a digitized phase voltage signal for the same input channel is supplied to an Nth order delay+fractional delay digital filter 252. In a preferred embodiment, digital filters 250 and 252 are 9th order filters. Digital filter 250 applies to the line current signal a delay that is an integral number of cycles of the sampling frequency of analog-to-digital converter 80. Digital filter 252 applies to the phase voltage signal a delay that is equal to the delay of digital filter 250 plus a fractional delay that is a fraction of the sampling frequency of analog-to-digital converter 80. The delays applied by digital filters 250 and 252 are controlled by digital filter coefficients as described below. The outputs of digital filters 250 and 252 are phase compensated digital current and voltage values, respectively, that represent the input line current and phase voltage for that channel. The digital filters 250 and 252 are repeated for each channel of the electronic meter.

The delayed voltage samples output by digital filter 252 are supplied to a computation unit 260 and to a first input of a multiplier 262. The computation unit 260 determines the root mean square voltage by squaring the voltage samples, summing the squared voltage samples over X samples and dividing by X, where X is determined by the number of samples acquired in 32 cycles of mains voltage. The delayed current samples output by digital filter 250 are supplied to a computation unit 264 and to a second input of multiplier 262. The computation unit 264 determines the root mean square current by squaring the current samples, summing the squared current samples over X samples and dividing by X. The output of multiplier 262 represents the product of each voltage and current sample pair. The output of multiplier 262 is supplied to a computation unit 266. The computation unit 266 determines active power as the sum of the products of current and voltage samples over X samples divided by X.

Figure 6:
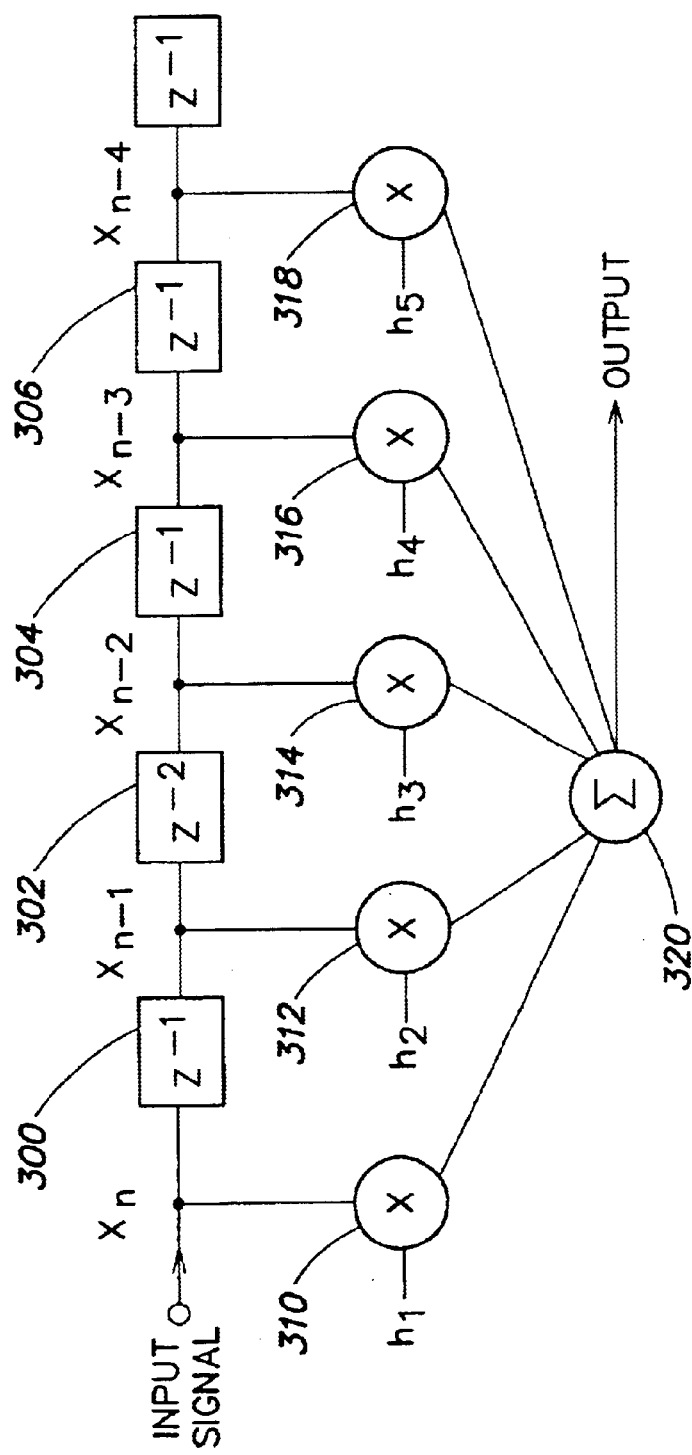
FIG. 6 is a block diagram of an example of a delay digital filter.

A block diagram of a delay digital filter is shown in FIG. 6. Input data samples are provided to series connected delay elements 300, 302, 304 and 306. The input sample and the outputs of delay elements 300, 302, 304 and 306 are multiplied by digital filter coefficients $h_1$–$h_5$ in multipliers 310–318, respectively. The outputs of multipliers 310–318 are summed by a summing unit 320 to provide output data samples. As noted above, the digital filter coefficients $h_1$–$h_5$ may be programmable to provide a desired delay. Fractional delay filters are described in "Design of Fractional Delay Filters Using Convex Optimization", Applications of Signal Processing to Audio and Acoustics, 1997 IEEE ASSP Workshop, October 1997, which is hereby incorporated by reference.

As noted above, digital filter coefficients for performing phase compensation are determined in a calibration process. Sets of digital filter coefficients are determined for each of the three current channels and each of the three voltage channels of sensing circuit 10 shown in FIG. 1. Preferably, sets of digital filter coefficients are determined on each channel for several different line current ranges to provide accurate phase compensation over the measurement range of the meter. The sizes of the line current ranges may be the same or different. For example, a first set of digital filter coefficients may be used over a first line current range of 0–1 amp, a second set of digital filter coefficients may be used over a second line current range of 1–5 amps, etc. Any number of line current ranges may be utilized.

Figure 7:
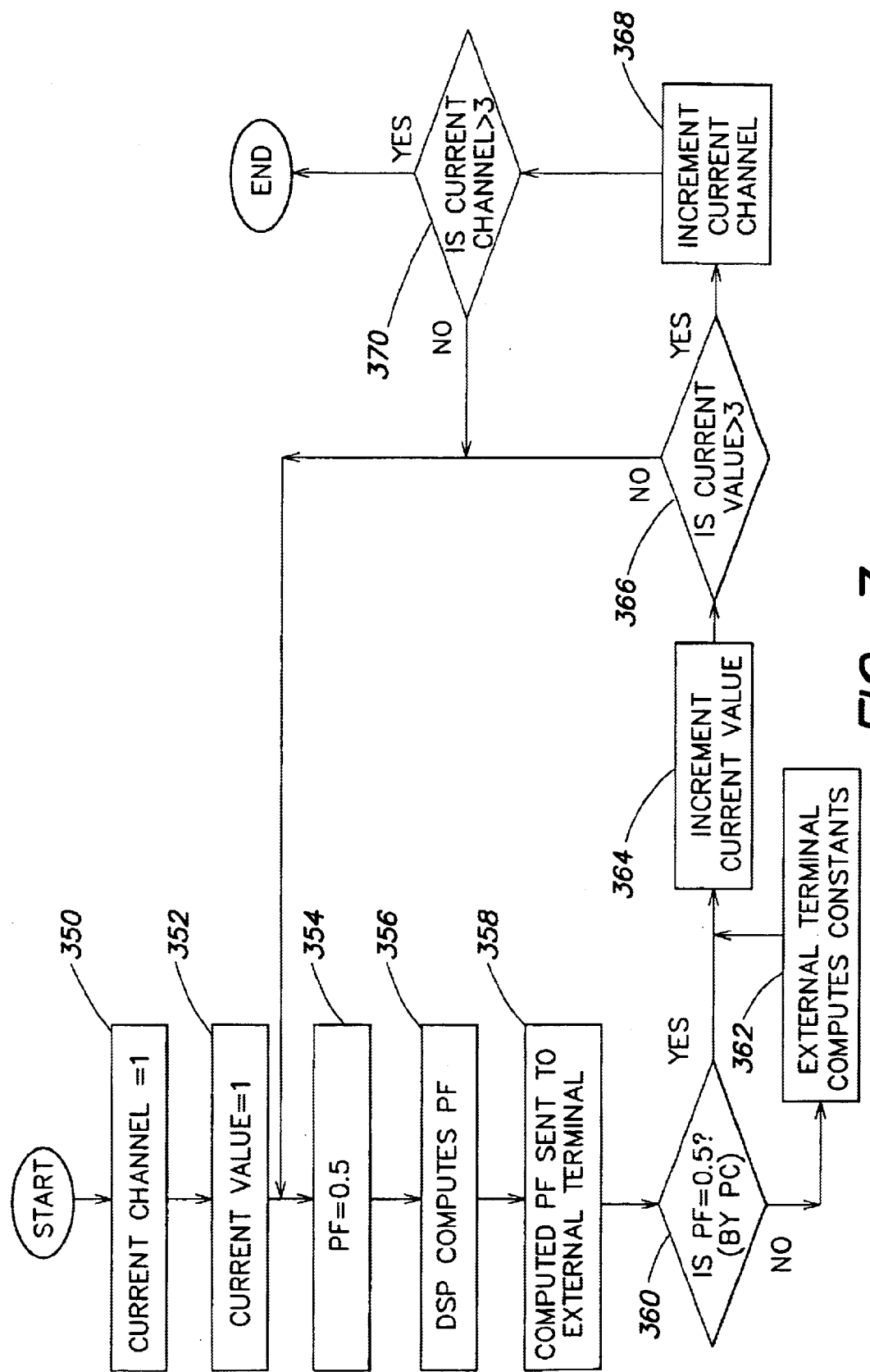
FIG. 7 is a flow chart that illustrates calibration of the electronic energy meter by computation of digital filter coefficients in an external computing device.

A preferred calibration procedure is now described with reference to FIGS. 1 and 7. FIG. 7 is a flow chart of the calibration procedure. In the preferred calibration procedure, digital filter coefficients are calculated by external terminal 26 for each current range of each channel. Referring to FIG. 7, the current channel is set to channel 1 in step 350, and the line current value in the selected channel is set a test current value having an index of 1 in step 352. Channels refer to sensing circuit channels that process line currents 30, 32 and 34 and phase voltages 90, 92 and 94. Assume that channel 1 corresponds to the channel for processing line current 30. Thus, a test current value having an index of 1 may correspond to a line current 30 of 1 ampere, for example.

In step 354, a test waveform is applied to the selected channel. The test waveform has the test current value, a known voltage and a known power factor. The power factor corresponds to a known phase difference between line current and phase voltage. Preferably, the test waveform has a power factor of 0.5, which corresponds to a phase difference of 60°. In step 356, the digital signal processor 12 computes the power factor of the test waveform input to the selected channel of the electronic meter. Because of the phase lag produced by the current transformer in sensing circuit 10, the power factor computed by digital signal processor 12 differs from the known power factor of the test waveform. The computed power factor is sent by digital signal processor 12 to external terminal 26 in step 358.

In step 360, the external terminal 26 determines whether the power factor received from digital signal processor 12 is equal to the known power factor of the test waveform. When the power factor received from digital signal processor 12 is not equal to the known power factor of the test waveform, the external terminal 26 computes digital filter coefficients in step 362. The computation of the digital filter coefficients is described below in connection with FIG. 8.

Following computation of the digital filter coefficients in step 362 or following a determination that the computed power factor is equal to the known power factor of the test waveform in step 360, the test current value is incremented in step 364. In step 366, a determination is made as to whether the index of the test current value is greater than 3. If the index of the current value is not greater than 3, the process returns to step 354 and a test waveform having the incremented test current value and the known power factor is applied to the selected channel. The process of determining digital filter coefficients as described above is repeated for the incremented test current value. Thus, sets of digital filter coefficients are determined for a series of different test current values on the selected input channel. This process provides three sets of digital filter coefficients for three line current ranges. It will be understood that digital filter coefficients may be determined for any number of line current ranges.

When a determination is made in step 366 that the index of the test current value is greater than 3, the channel is incremented in step 368. Thus, for example, the channel being calibrated is incremented from the channel connected to line current 30 to the channel connected to line current 32. In step 370, a determination is made as to whether the current channel is greater than 3. When the current channel is not greater than 3, the process returns to step 354 and a test waveform having a known power factor is applied to the newly selected channel. Sets of digital filter coefficients are determined for a series of test current values for the newly selected channel. The process is repeated for each channel in the electronic meter. The digital filter coefficients, with corresponding channel and current range information, are downloaded from external terminal 26 to digital signal processor 12 for use during normal metering operation.

Figure 8:
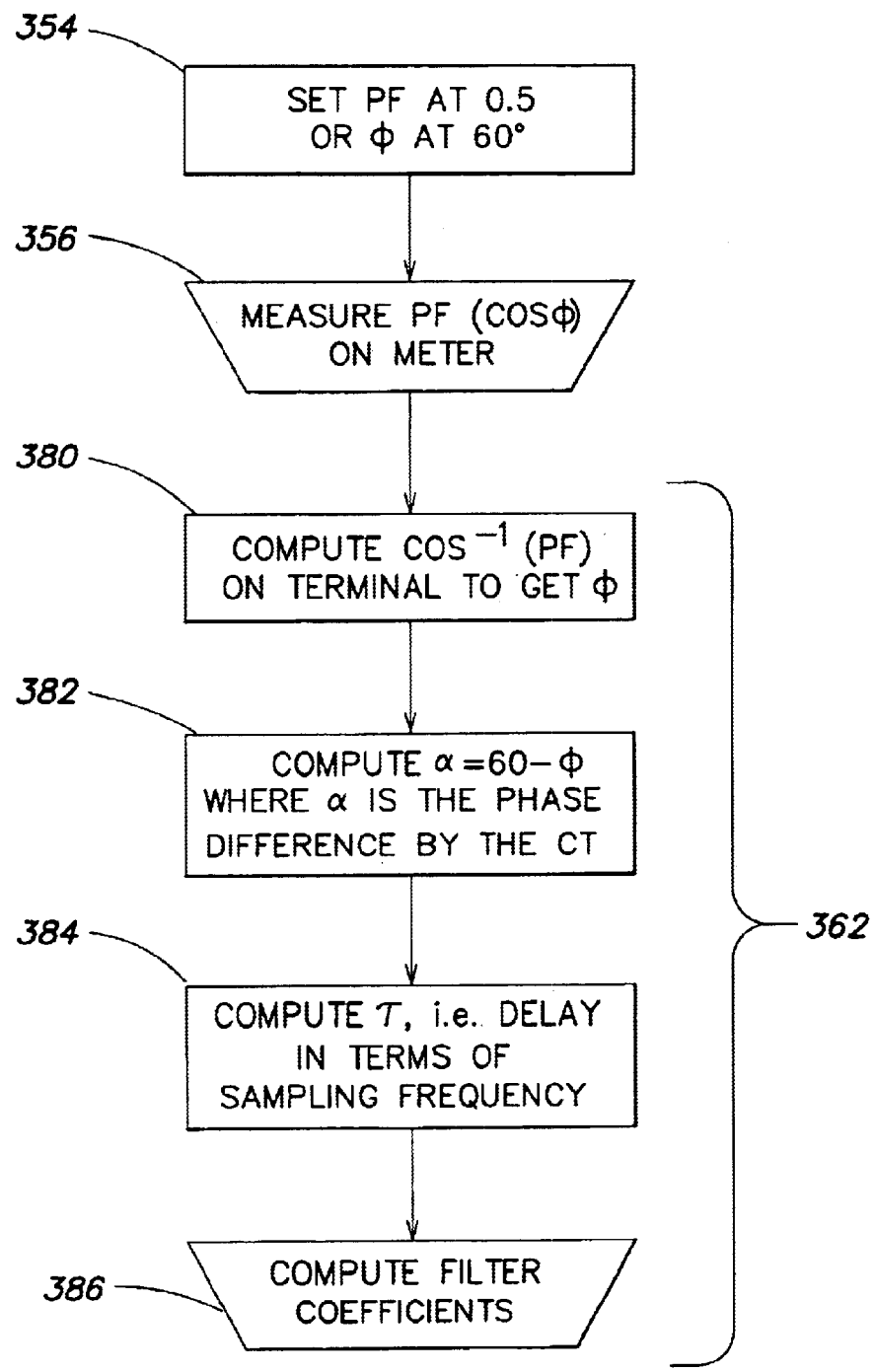
FIG. 8 is a flow chart that illustrates computation of digital filter coefficients in the flow chart of FIG. 7.

A flow chart of an example of a process for determining digital filter coefficients is shown in FIG. 8. Like elements in FIGS. 7 and 8 have the same reference numerals. As described above, the power factor of the test waveform is set at 0.5 in step 354, and the power factor of the test waveform is measured by the electronic meter in step 356. In step 380, external terminal 26 determines the measured phase based on the power factor determined by digital signal processor 12. In particular, the power factor is the cosine of the phase shift angle between voltage and current. In step 382, the phase error is determined as the difference between the known phase angle of the test waveform and the measured phase. Where the test waveform has a power factor of 0.5, the phase error is equal to 60° minus the measured phase. In step 384, the delay corresponding to the phase error is computed as a fraction of the sampling interval. As noted above, the sampling frequency is preferably 15 kilohertz per channel. In step 386, the delay corresponding to the phase error is used to compute the digital filter coefficients. The digital filter coefficients may be computed from the delay as described in the above-identified article describing fractional delay filters. The computed digital filter coefficients are downloaded to digital signal processor 12 for use during normal metering operation.

The digital filter coefficients determined for each channel of the electronic meter are associated with the respective digital filters for each channel. A set of digital filter coefficients is selected in response to the input current value during normal metering operation. Each set of digital filter coefficients may be used over a range of line current values. For example, the digital filter coefficients computed at a current value of 1.0 amp may be used for line currents over a range of 0.5 to 1.5 amp. It will be understood that the number of sets of digital filter coefficients and the increments in current values may be different in different meters, depending on the required accuracy and the expected current range.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method for calibrating an electronic meter, comprising the steps of:
    (a) applying to an input of the electronic meter a test waveform having a known phase shift between voltage and current;
    (b) measuring a phase shift between the voltage and the current of the test waveform using the electronic meter;
    (c) determining a phase shift error based on the difference between the known phase shift and the measured phase shift;
    (d) determining digital filter coefficients to produce a digital filter delay that corresponds to the phase shift error; and
    (e) saving digital filter coefficients to compensate for the phase shift error during normal metering operation.

2. A method as defined in claim wherein step (a) comprises applying waveforms of a polyphase power line to the input of the electronic meter and wherein steps (b), (c), (d) and (e) are repeated for each phase of the polyphase power line.

3. A method as defined in claim 1 wherein steps (a), (b), (c), (d) and (e) are repeated for predetermined current ranges to provide a set of digital filter coefficients for each of the predetermined current ranges.

4. A method as defined in claim 1 wherein the step of determining digital filter coefficients is performed in a computing device external to the electronic meter and wherein the digital filter coefficients are downloaded from the external computing device to the electronic meter.

5. A method as defined in claim 4 wherein the electronic meter includes a digital signal processor and wherein the digital filter coefficients are downloaded to the digital signal processor.

6. A method as defined in claim 4 wherein step (b) comprises measuring the power factor of the test waveform with the electronic meter, sending the measured power factor to the external computing device and determining the measured phase shift from the measured power factor in the external computing device.

7. A method as defined in claim 1 wherein step (a) comprises applying a test waveform to an input of an electronic watthour meter.

* * * * *

UNITED STATES PATENT AND TRADEMARK OFFICE
CERTIFICATE OF CORRECTION

PATENT NO. : 6,759,837 B2
DATED : July 6, 2004
INVENTOR(S) : Guljeet S. Gandhi

It is certified that error appears in the above-identified patent and that said Letters Patent is hereby corrected as shown below:

Column 8,
Line 32, -- 1 -- should be added after the word "claim".

Signed and Sealed this

Twenty-third Day of November, 2004

JON W. DUDAS
*Director of the United States Patent and Trademark Office*